United States Patent [19]

Hill

[11] 4,199,715

[45] Apr. 22, 1980

[54] METHOD AND APPARATUS FOR DEFINING AN EQUIPOTENTIAL LINE OR SURFACE IN THE EARTH'S ATMOSPHERE AND MEASURING THE MISALIGNMENT OF A SELECTED LINE OR PLANE RELATIVE TO AN EQUIPOTENTIAL LINE OR SURFACE

[75] Inventor: Maynard L. Hill, Silver Spring, Md.

[73] Assignee: The Johns Hopkins University, Baltimore, Md.

[21] Appl. No.: 880,786

[22] Filed: Feb. 24, 1978

Related U.S. Application Data

[60] Continuation-in-part of Ser. No. 524,334, Nov. 15, 1974, Pat. No. 4,091,326, which is a division of Ser. No. 301,363, Oct. 27, 1972, Pat. No. 3,868,074.

[51] Int. Cl.$^2$ ..................... G01R 29/12; B64C 13/16; G05D 1/10
[52] U.S. Cl. .................................. 324/72; 244/177; 324/457
[58] Field of Search .................... 324/32, 72; 318/584, 318/585; 244/76 R, 177; 340/27 AT

[56] References Cited

U.S. PATENT DOCUMENTS 2,454,630  11/1948  Buckthal ................................ 324/32

OTHER PUBLICATIONS

Clark, John F., "*Airborne Measurement of Atmospheric Potential Gradient*" Journal of Geophysical Research, vol. 62, No. 4, Apr. 1957 pp. 617–628.
Vonnegut et al. "*Adjustable Potential-Gradient-Measuring App. for Airplane Use*," Journal of Geophysical Research, vol. 66, No. 8, Aug. 1961 pp. 2393–2396.
Vonnegut et al., "*Apparatus Using . . . for Measuring . . . Atmospheric Potential Gradient from an Airplane*", Bull. of the Amer. Meteor. Soc., vol. 42, No. 11, Nov. 1961, pp. 773–777.
MacReady, Jr., Paul B., "*Improving Thermal Soaring Flight Techniques*" Soaring (Soaring Soc. of Amer.), Dec. 1961, pp. 6–11.

*Primary Examiner*—Gerard R. Strecker
*Attorney, Agent, or Firm*—Robert E. Archibald; Marc A. Block

[57] ABSTRACT

The present invention relates to a method and apparatus for detecting the earth's static electric field and determining the contour of its equipotential lines and surfaces and for utilizing the detected field as a reference for other measurements. In particular, the contour of the field can be determined by sensing the potential at a plurality of points and measuring the differences in potential at the points with a differential static amplifier. Alternatively, a fluxmeter for measuring the electric field vector directly can be used to sense changes in the magnitude and direction of the field. A line defined between two points or a plane defined by three noncolinear points in space can be made to coincide with an equipotential line or surface in space, respectively, by adjusting the relative positions of the points such that either the potential differences between the points or the field components sensed along the defined line or in the defined plane are zero. Similarly, a desired disorientation between the defined line or plane and the respective equipotential line or surface can be readily effected.

7 Claims, 9 Drawing Figures

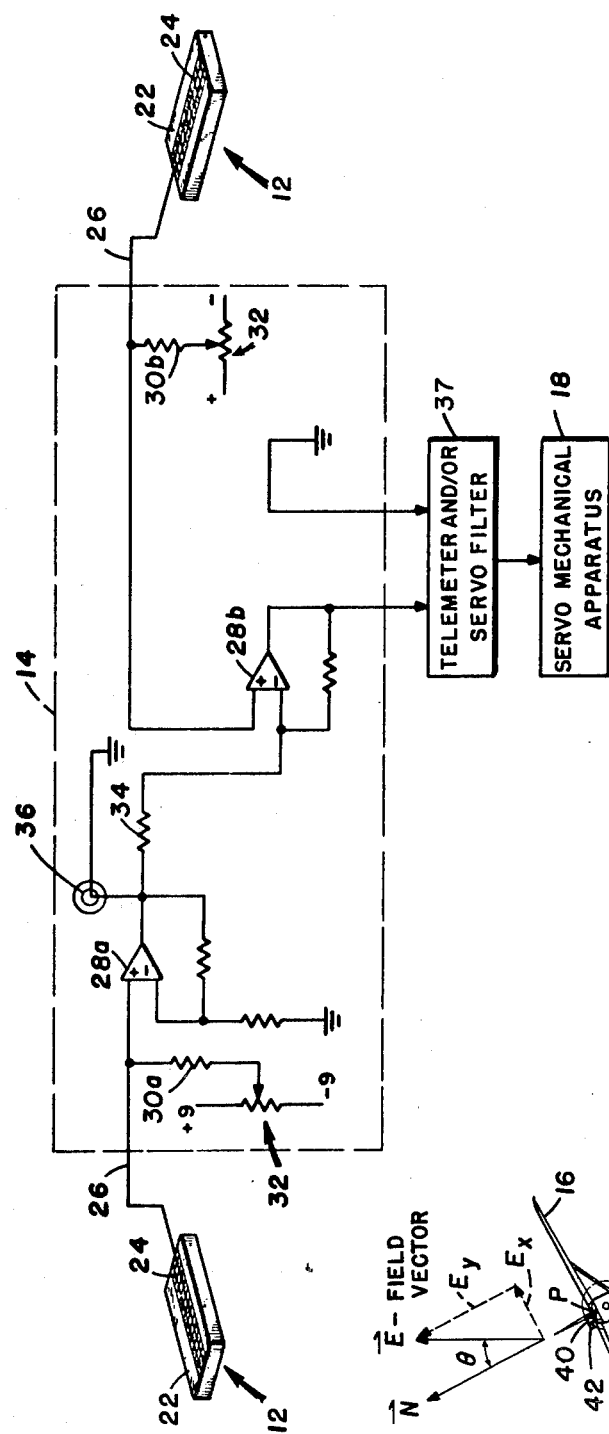
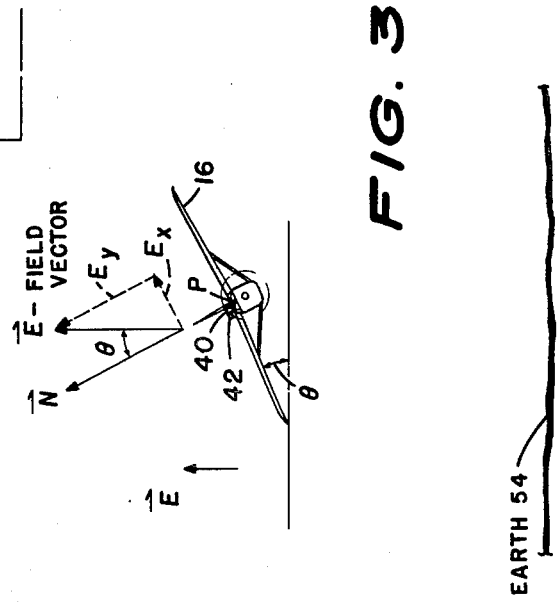
FIG. 2
FIG. 3

METHOD AND APPARATUS FOR DEFINING AN EQUIPOTENTIAL LINE OR SURFACE IN THE EARTH'S ATMOSPHERE AND MEASURING THE MISALIGNMENT OF A SELECTED LINE OR PLANE RELATIVE TO AN EQUIPOTENTIAL LINE OR SURFACE

STATEMENT OF GOVERNMENT INTEREST

The invention disclosed and claimed herein resulted from work performed under or in the course of a contract with the Department of the Navy.

CROSS-REFERENCE TO RELATED APPLICATION

This is a continuation-in-part of application Ser. No. 524,334, now U.S. Pat. No. 4,091,326, filed Nov. 15, 1974, which is a divisional of Ser. No. 301,363, now U.S. Pat. No. 3,868,074, filed Oct. 27, 1972.

BACKGROUND AND SUMMARY OF THE INVENTION

The existence of a static electric field in the earth's atmosphere has long been recognized. More recently, this static electric field was determined to exhibit an essentially vertical gradient, the change in potential per meter decreasing with increasing altitude. Thus, at any altitude, equipotential lines and surfaces are essentially horizontal, especially in a localized area, subject to protrusions on the earth's surface. The ability to define such a horizontal equipotential line or surface in the atmosphere provides a reference for aircraft stabilization, gyroscopic drift correction, and clear air turbulence detection. Additionally, detection of tilted equipotential lines or surfaces in the vicinity of various physical objects provides a reference for obstacle avoidance apparatus.

In particular, the present invention provides methods for utilizing the earth's static field to obtain a reference signal which can be employed to control both pitch and roll axes stabilization of airborne vehicles. In a general sense, the invention provides for continuously defining an equipotential line or surface within the earth's generally vertical static potential gradient. Definition of this equipotential line or surface is indicated by DC voltage signals produced by apparatus associated with the invention, these signals being usable to accomplish a variety of functions. One method of the invention comprises immersing at least two voltage probes or the like, which sense potential magnitude, in the earth's static potential gradient and measuring the difference sensed by the two probes. If the two probes sense the same potential, i.e., the difference between the voltages generated at each probe is zero, then the probes lie on a line or surface of equal potential, usually horizontal due to the vertical nature of the earth's static potential gradient. Similarly, an equipotential plane may be defined by two pairs of voltage sensing probes or by three probes, one of which is referenced to the electrical center or some other point located between the other two probes. Even where the vertical gradient is distorted due to physical objects or ionization sources, nonhorizontal equipotential lines and surfaces may be sensed by the present invention.

Alternatively, the angle of misalignment between a line or plane containing two points in space or three noncolinear points in space, respectively, and an intersecting equipotential line or surface, respectively, can be readily determined without specific resort to roll or pitch measurements. One technique which may be used provides for determining the field vector associated with the point-containing line or plane. When the field vector is perpendicular to the associated line or plane, such line or plane is on the equipotential. A conventional electrostatic fluxmeter or field mill as described in *Atomspheric Electricity* by Chalmers (2nd Edition), pps. 143–145, can perform this function. As an alternative to measuring vector angle directly, a conventional vector resolver can be used to determine the magnitude of the field components along the line or in the plane defined by the points in space, viz. the plane of the aircraft. When such field components are zero, the field vector is perpendicular and the points are of equipotential. The angle between the field vector and the perpendicular, which can be found readily by conventional techniques, represents the misalignment angle (e.g. angle of banking, climbing, or diving) of an aircraft that contains the two or three points in space. A signal proportional to or related to the angle can be generated and fed to a servomechanism which can adjust the aircraft wings or fins to drive the minimal angle to zero (or some other angle), if desired, aligning the plane of the aircraft with an equipotential surface or as otherwise desired to control aircraft orientation.

One apparatus associated with the present invention comprises sensing probes (which probes may be comprised of radioactive material in order to increase the electrical contact thereof with the atmosphere) and a differential static amplifier. The amplifier receives the sensed potentials from the probes and measures the difference in the sensed potentials to produce a voltage difference signal which may be utilized to control a servomechanical or other apparatus. The voltage sensing probe/differential static amplifier combination is referred to hereinafter as a differential static voltmeter. The actual or effective combination of two differential static voltmeters can essentially define an equipotential surface in the earth's vertical static potential gradient. Since this equipotential surface is defined within a relatively small space, the surface is essentially flat and horizontal and may be used as a reference plane for aircraft stabilization.

If the sensing probes described above are attached to the wingtips of an aircraft or essentially along the transverse axis thereof, then the voltage difference between the probes measured by the differential static amplifier is a function of the roll angle of the aircraft. Similarly, the voltage difference sensed by a pair of sensing probes disposed essentially along the longitudinal axis of an aircraft is a function of the pitch angle of the aircraft. The differential voltage output signals thus produced for the pitch and roll orientations of the aircraft can be used to drive a servomechanical system to maintain the aircraft in level flight relative to the surface of the earth. The sensing probes need not be exactly aligned with or parallel to the transverse or longitudinal axes of the aircraft in order to produce useful information. Similarly, the probes need not be positioned at exactly the same elevation relative either to the earth's surface or to the horizontal axis of the aircraft.

In an embodiment where the probes are replaced by an electrostatic fluxmeter, field mill, or the like a similar servomechanical system can be utilized to adjust or measure the orientation of the aircraft. With the fluxmeter, the direction of the field vector can be derived relative to a line (such as wing-to-wing or nose-to-tail) of or to the plane of the aircraft, or, alternatively, the normal to such line or plane. The orientation of the aircraft can be changed to place the vector in a desired direction with respect to the normal to the plane of the aircraft. If the field vector is on the normal, the field component in the plane of the aircraft is zero and the aircraft is on an equipotential. By measuring the angle of the field vector with respect to the normal, the angle of misalignment is readily determined. By measuring the field component in the plane (or along a selected line) of the aircraft, a quantitative determination of the magnitude of misalignment results. Using either or both measures, the misalignment can be converted into a signal or signals which may be used in aircraft orientation, stabilization, or the like. Due to the customary roll and pitch control elements on the aircraft the system may, as in the voltage probe embodiment, derive separate signals for the separate control elements.

The invention, as discussed, provides for the measuring of the angle between a reference equipotential surface and a plane containing at least three noncolinear points in space at which sensors are located.

The invention also relates to a method and apparatus for measuring the roll rate or pitch rate of an airborne vehicle. The apparatus used to sense rate comprises a pair of conductive wires disposed essentially along or parallel to the transverse axis or longitudinal axis of the aircraft. Rotation of these wires in the earth's static electric field generates a current in the wires. The generated current is measured by a current meter, the intensity of the current being proportional to the roll rate or pitch rate of the vehicle.

Thus, it is an object of the invention to provide a method and apparatus for continuously defining an equipotential line or plane in the earth's static electric field relative to a given line or plane.

It is another object of the invention to provide differential voltage sensing apparatus aboard an airborne vehicle, the differential voltage sensed by said apparatus being a function of the roll or pitch attitude angle of the vehicle.

It is a further object of the invention to provide a differential static current meter for determining the roll rate or pitch rate of an airborne vehicle by measuring the current induced in a pair of conductive wires rotated in the earth's static potential gradient.

Further objects and advantages of the invention will become more readily apparent in light of the following detailed description.

BRIEF DESCRIPTION OF THE DRAWINGS

FIG. 2 is a detailed diagram of the circuitry of the voltmeter of FIG. 1;

FIG. 3 is a schematic view of an aircraft with a fluxmeter, showing the field vector sensed and its components;

DESCRIPTION OF EMBODIMENTS OF THE INVENTION

The several embodiments of the invention use the earth's static potential gradient as a reference for generating an information-bearing electrical signal. The generated signal may then be used to perform a variety of functions, such as the stabilization of an airborne vehicle. The invention essentially provides a method and means for measuring the direction of the earth's static electric field relative to an airborne body to determine the orientation of the body and adjust the orientation as desired. In a simple form of the invention, a differential static voltmeter is utilized to generate a signal proportional to the misalignment of a line joining two spaced sensors relative to an equipotential line which, ideally, is parallel to the surface of the earth. An effective combination of two differential static voltmeters can be used to define an equipotential surface, rather than just a line, within the earth's static potential gradient. The equipotential surface thus defined is usually essentially parallel to the earth's surface, thereby creating an artificial horizontal surface which can then be utilized for stabilization of an airborne vehicle in both pitch and roll. The invention thus contemplates utilization of the earth's static potential gradient to provide roll attitude and roll rate and/or pitch attitude and pitch rate information in the form of an easily obtained DC signal.

The use of one or a plurality of electrostatic fluxmeters is also contemplated, wherein the fluxmeters provide electric field information which can be used in determining aircraft orientation with respect to the earth's potential gradient.

Figure 1:
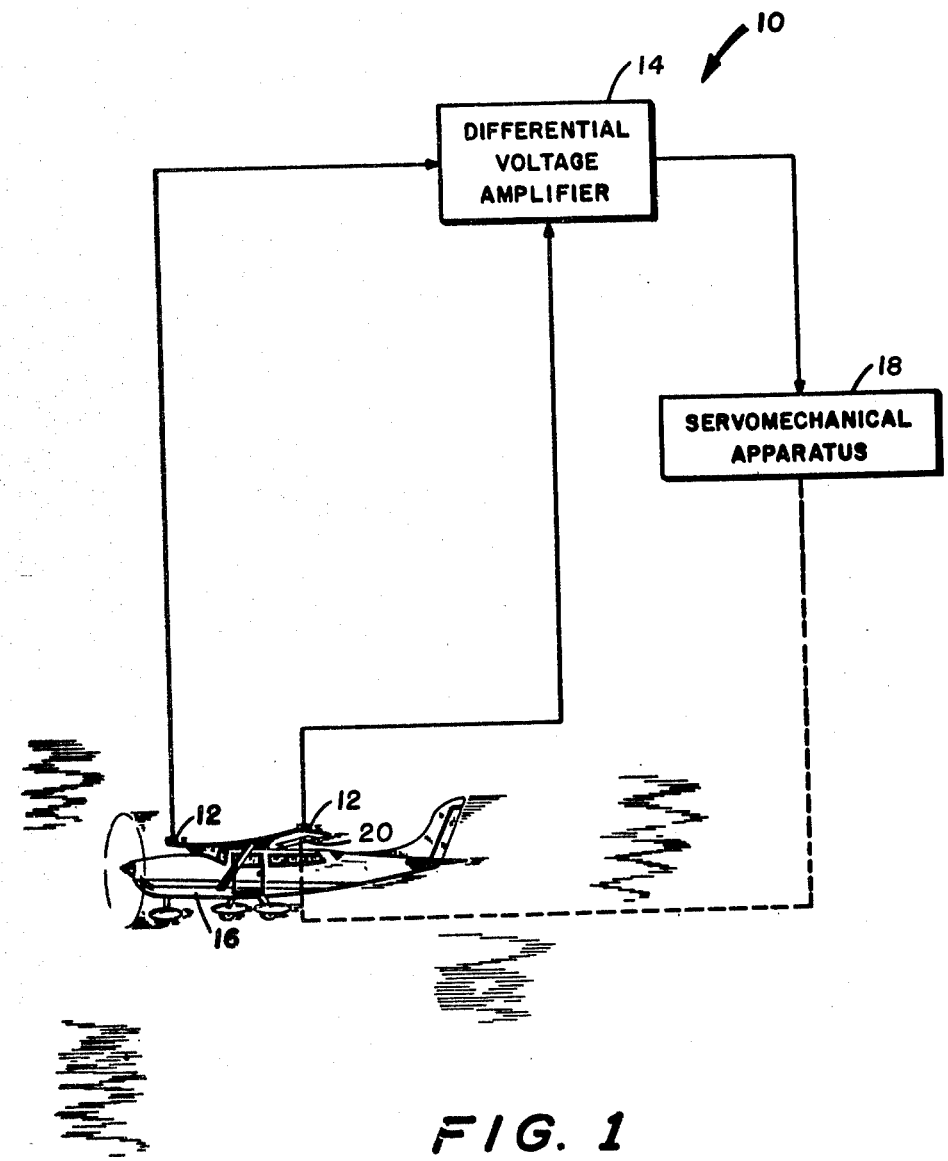
FIG. 1 is a schematic view of a differential static voltmeter mountable on an aircraft.

Referring to FIG. 1 a differential static voltmeter is seen at 10 to comprise two sensing probes 12 and a differential voltage amplifier 14, the probes 12 being mounted for illustration on the wingtips of an aircraft 16. The output signal of the voltmeter 10, i.e., essentially the output signal of the amplifier 14, can be directed to well-known servomechanical apparatus 18 to accomplish a desired function, such as to ailerons 20 to provide roll stabilization or can be used to simply indicate the degree of misalignment between a line joining the wingtips and the equipotential, i.e., the angle of banking. The sensing probes 12 may comprise metal pads 22 (see FIG. 2) coated with a layer 24 of a radioactive metal or metal salt to increase the conductivity of the air in the vicinity of the probes by alpha particle emission (and thus facilitate ionization of the air), by improving the electrical contact of the probes 12 with the air. The probes 12 may also comprise conductive needle-like points or thin pointed metal wires, chemical sprays, hot gases, etc. The probes 12 respond rapidly to variations in potential encountered in the atmosphere. The voltage at the probes 12 produces a low impedance input to the differential voltage amplifier 14.

As can be particularly seen in FIG. 2, the probes 12 are electrically joined to the amplifier 14 by either coaxial cables or other electrical connections 26 to maintain a high insulation resistance in the probe wiring to avoid leakage paths. The differential voltage amplifier 14 comprises two operational amplifiers 28a and 28b, the amplifiers 28a and 28b receiving the inputs from one of each of the probes 12. Inserted in the circuit between each of the probe/amplifier combinations are resistors 30a and 30b joined in series to potentiometers 32. The resistors 30a and 30b cause a high impedance input into the operational amplifiers 28a and 28b. The output for amplifier 28a is fed through resistor 34 into the negative terminal of the amplifier 28b, the positive terminal of the amplifier 28b being received directly from the resistor 30b. The output signal resulting from the amplifier 28b, thus the signal generated within the differential voltage amplifier 14, is proportional to the difference in potential measured between the two probes 12. If the probes 12 are level with respect to an ambient equipotential line or surface, a zero differential voltage results. Elevation of one of the probes 12 above the other probe produces a differential voltage signal proportional to the difference in elevation between the probes, the voltage difference resulting from the vertical static potential gradient existing in the earth's atmosphere. The differential static voltmeter 10 can then be seen to be capable of performing a variety of functions, one of which being the stabilization in pitch or roll of an airborne vehicle. By disconnecting the probes 12 from amplifier 14, the resistor 30a may be adjusted to zero volts at 36 and the resistor 30b adjusted to a desired output which represents a neutral horizontal gradient. Placement of one of the probes 12 on the opposite wingtips of the aircraft 16 results in a static voltmeter output which is proportional to the bank angle of the aircraft 16. Similarly, a static voltmeter 10 having its probes 12 mounted effectively along the longitudinal axis of the aircraft 16 produces an output proportional to the dive or climb angle of said aircraft. The output signals from the static voltmeters 10 so mounted on the aircraft 16 can then be filtered and fed to the servomechanical apparatus 18, through a telemeter or servo filter 37. Pitch or roll stabilization may thus be accomplished. A combination of two static voltmeters 10 may be used to stabilize an airborne vehicle in both pitch and roll.

As an alternative to the embodiment which uses the probes 12, FIG. 3 shows the use of a conventional electrostatic fluxmeter 40 which produces a vector indicating the magnitude and direction of the electric field at a point P on the aircraft. The normal $\overline{N}$ to the aircraft 16 is also shown at point P at an angle $\theta$ relative to the $\overline{E}$-field vector. $\theta$, it is readily observed, is the banking angle of the aircraft 16. Connecting the angle output from the fluxmeter 40 to a servomechanical apparatus (such as in FIG. 1), the orientation of the aircraft 16 can be changed until $\theta$ reaches a desired value. Although illustrated in two dimensions, FIG. 3 also pertains to orientation in three dimensions (i.e. pitch and roll). In three dimensions, a conventional vector resolver 42 may be included which transforms the $\overline{E}$-field vector into three components: one which is perpendicular to the plane of the aircraft 16 and two which are within the plane of the aircraft 16. To determine the orientation of the aircraft 16 relative to an equipotential surface found in the earth's static electric field $\overline{E}$, the various field component measurements can be used. If components $E_x$ and $E_z$ (the z-axis not shown comes out the page on FIG. 3) at point P are zero there is no field component along the wing-to-wing or nose-to-tail axes; the wings as well as the fore and aft portions of the aircraft 16 should be on an equipotential line. Otherwise, by measuring the $\overline{E}$-field and its components at a selected point P, the position of an equipotential line or surface relative to the aircraft 16 and the contour of the equipotential line or surface can be readily determined. Signals to servomechanical apparatus (such as 18 of FIG. 1) can also be provided to control or stabilize the flight of the aircraft 16 as desired.

Figures 4, 5:
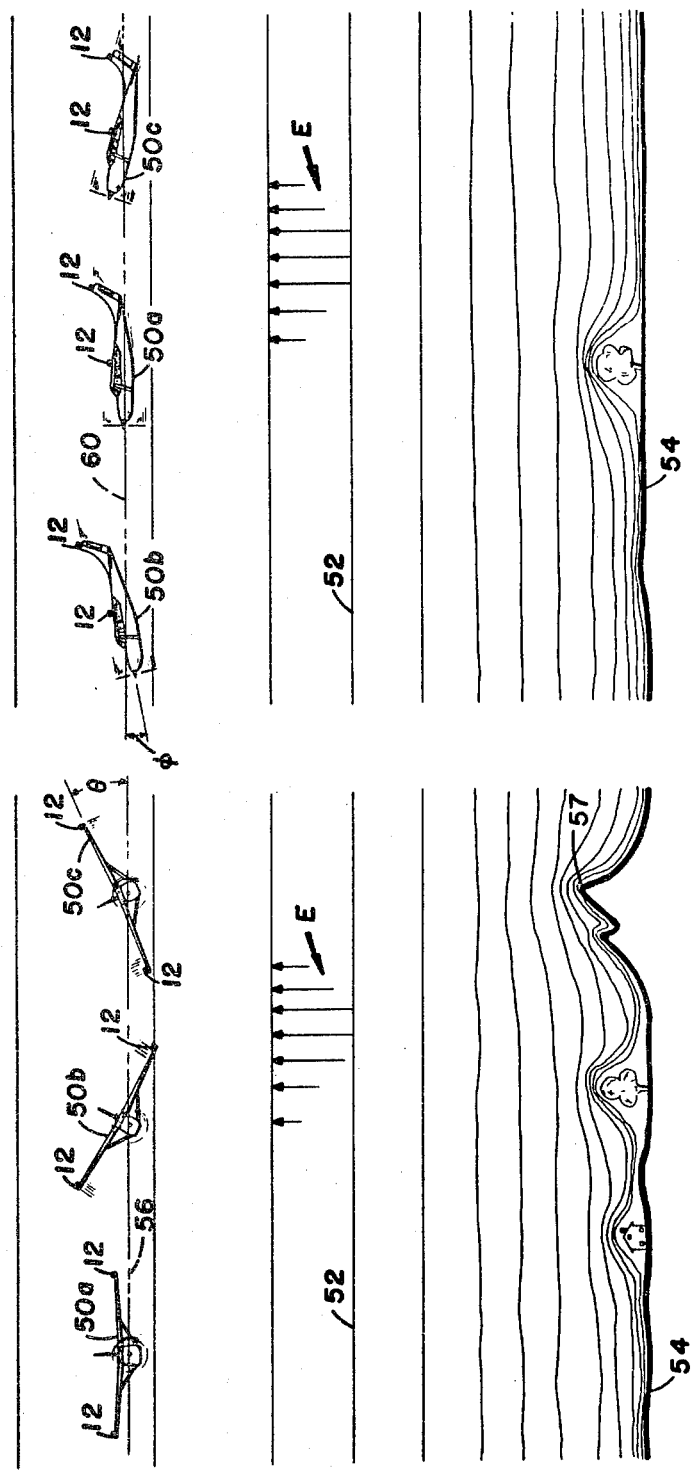
FIG. 4 is a schematic view of an aircraft illustrating roll orientations of the aircraft.
FIG. 5 is a schematic view of an aircraft illustrating pitch orientations of the aircraft.

FIG. 4 shows three aircraft 50a, 50b, and 50c fitted with static voltmeters and operating in the static electric field $\overline{E}$, the probes 12 being visible on the wingtips of the aircraft. The field $\overline{E}$ is seen to exhibit a vertical gradient, the static potential per meter in the atmosphere decreasing with altitude. Thus, the lines 52 forming the static electric field $\overline{E}$ are shown as parallel lines which are closer together near the earth's surface 54. This potential gradient when compared to the potential difference measured between the probes 12 gives a measure of misalignment of the aircraft 50a, 50b, or 50c relative to an equipotential line. Specifically, if the potential gradient is 1 volt/meter and the potential difference between probes 12 spaced, for example, at 10 meters is 5 volts, a misalignment angle $\theta$ of 30° is readily determinable. An equipotential line which intersects the line connecting the probes 12 at an angle essentially in a vertical plane is thus defined. The lines 52 are distorted and tilted about mountains 57 or other such obstacles. The aircraft 50a is seen to be operating in level flight the wingtips of the aircraft 50a being aligned along a line 56 which is parallel to the earth's surface 54. The probes 12, which need not be fitted on the wingtips of the aircraft 50a but could be spaced closely together within a small unit mounted virtually anywhere on the aircraft, are aligned essentially along the horizontal line 56. However, greater mutual spacing of the probes 12 generally yields greater sensitivity to attitude misorientation of the aircraft. The probes 12 sense the same static potential while in the roll attitude illustrated by the aircraft 50a, the differential voltage amplifier 14 (see FIG. 1) joined to the probes 12 producing a zero differential voltage output signal which indicates that the aircraft 50a has a zero roll angle. The aircraft 50b is shown to have a "left bank" roll orientation, i.e., the left wingtip of the aircraft is lower relative to the earth's surface than the right wingtip. In such an orientation, a differential voltage output signal is produced which is proportional to the difference in elevation of the probes 12 on the wingtips. This difference in probe elevation is geometrically proportional to the roll angle $\theta$ defined by the intersection of the horizontal line 56 and the straight line adjoining the probes 12. Similarly, the aircraft 50c has a "right bank" roll orientation, the difference in elevation between the probes 12 on the wingtips of the aircraft producing a voltmeter output which is proportional to the angular roll orientation of the aircraft. By defining the "left bank" orientation of the aircraft 50b as a positive roll angle and the "right bank" orientation of the aircraft 50c as a negative roll angle, the output of the voltmeter 10 can provide a pilot with an indication not only of the degree of the roll angle $\theta$ but also of the direction.

FIG. 5 also shows the aircraft 50a, 50b, and 50c in the earth's static electric field $\overline{E}$, a side elevational view of the aircraft being shown such that the pitch angle $\phi$ of the aircraft relative to a horizontal line 60 may be observed. The longitudinal axis of the aircraft 50a is aligned parallel with the horizontal line 60, thereby being also parallel to the earth's surface 54, the probes 12 being disposed essentially along the longitudinal axis of the aircraft 50a. The probes 12 thus sense the same static potential and the voltmeter to which the probes 12 are connected produces a zero differential voltage output signal which indicates that the aircraft has a zero pitch angle. The aircraft 50b is seen to be diving, or pitched downwardly, the probes 12 on the fore and aft of aircraft 50b thereby having a different elevation. The probe 12 on the front of the aircraft 50b senses a more negative static voltage than does the probe 12 toward the rear of the aircraft. This sensed difference in voltage is reflected in the output signal of the differential static voltmeter to which the probes 12 are electrically connected, which output signal is proporational to the pitch angle $\phi$ formed by the intersection of the horizontal line 60 and the longitudinal axis of the aircraft. Similarly, the aircraft 50c is seen to be climbing, or pitched upwardly, the difference in elevation between the probes 12 on the aircraft producing a voltmeter output which is proportional to the angular pitch orientation of the aircraft.

Referring to both FIG. 4 and FIG. 5, another use of the present invention becomes apparent. If the aircraft 50a in the figures maintains a constant level course, variations sensed by the probes 12 (or by the fluxmeter or field mill 40 of FIG. 3) will reflect changes in the contour or shape of the equipotential along the line of flight. An estimate of terrain as well as the equipotential characteristics can be determined by such continuous measurement of the field direction.

Figure 6:
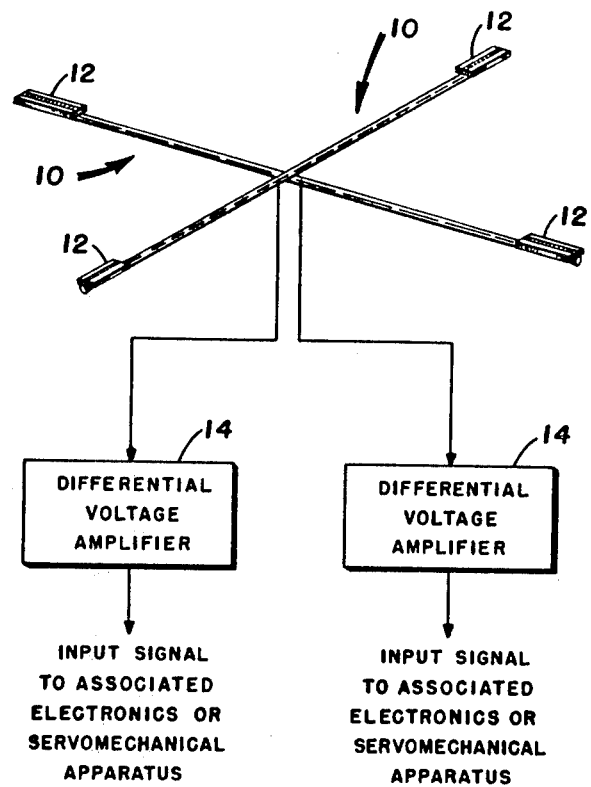
FIG. 6 is an idealized schematic view of an equipotential plane detector comprised of two differential static voltmeters.

Use of a pair of differential static voltmeters 10 such as is schematically shown in FIG. 6 allows definition of an equipotential surface within the static potential gradient in the atmosphere. Each pair of probes 12 in FIG. 6 may be considered to lie along a line or axis joining said probes. If these axes are turned at angles to each other such as the 90° angles shown in FIG. 6, then each voltmeter 10 will define an equipotential line when the output thereof is zero. When the output of both voltmeters 10 is zero, then the plane in which the four probes 12 lie would have a substantially equal static potential value at every point in the plane. Due to the relative localized measurement made by the voltmeters 10, the equipotential surface is usually parallel to the surface of the earth, thereby defining an artificial horizontal surface which may be used as a reference for a number of functions including aircraft stabilization, gyroscopic drift adjustment, turbulence detection and unmanned aircraft guidance. Each pair of probes 12 in each voltmeter 10 is electrically connected to a differential voltage amplifier 14 such as has previously been described. The output of each of the amplifiers 14 may be used to accomplish a desired function. When the static potential gradient is tilted due to obstacles such as moutains, (as can be seen in FIG. 4), detection of the tilted equipotential plane is useful in preventing an airborne vehicle from colliding with the obstacle. For example, an aircraft stabilized in horizontal flight with respect to an essentially level portion of the earth's surface is capable of avoiding a mountain or hill which tilts the potential gradient. By sensing the tilted equipotential surface caused by the obstacle and stabilizing the aircraft with respect to the tilted equipotential plane, the aircraft automatically assumes the proper heading to fly over or around the obstacle.

Figure 7:
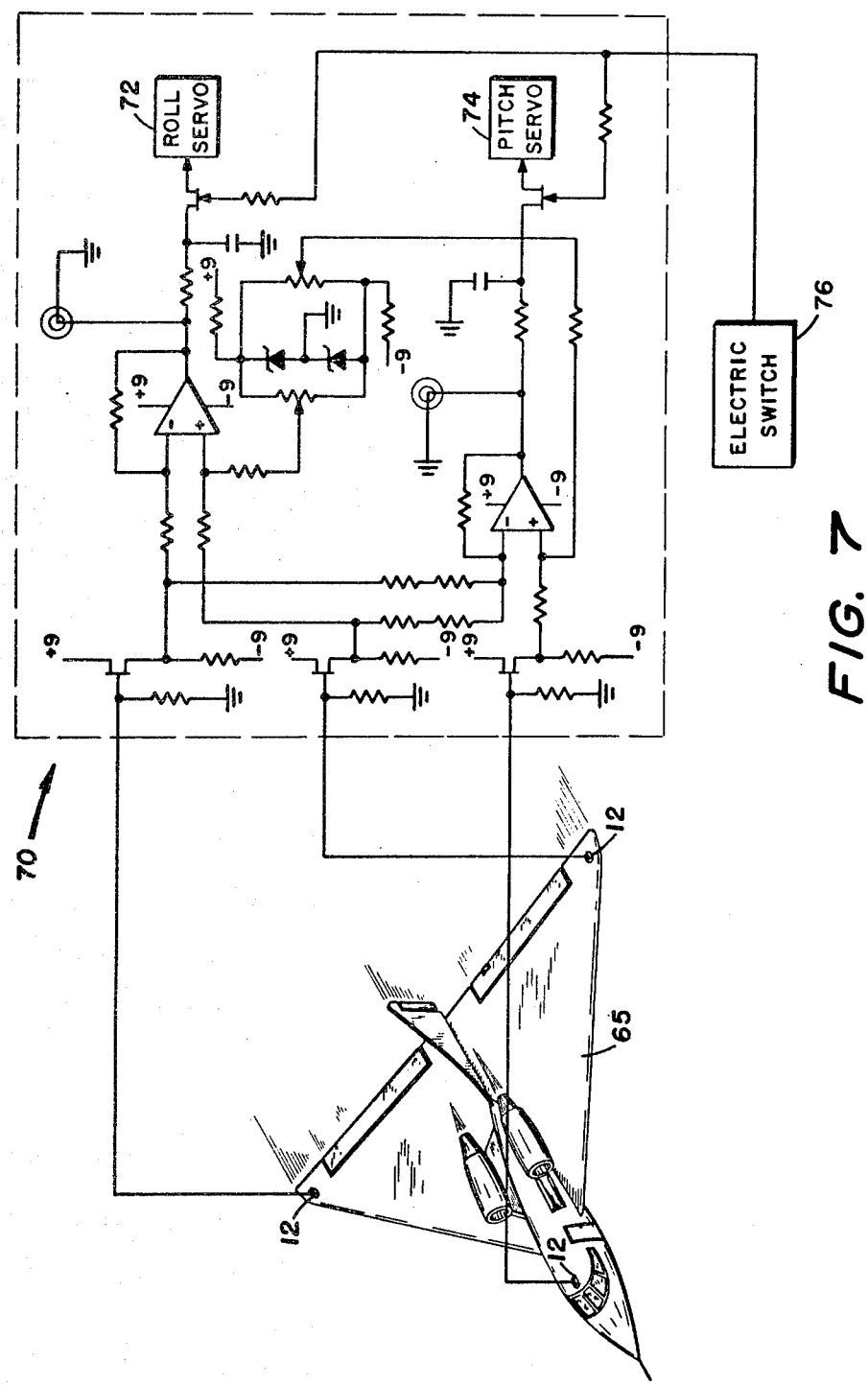
FIG. 7 is a schematic view of an aircraft fitted with an equipotential plane detector comprised of three voltage sensing probes, the detector being shown in part as a detailed circuit diagram.

Simultaneous stabilization in pitch and roll may also be accomplished using the system 70 shown in FIG. 7. Three probes 12 are located on an aircraft 65, the aircraft 65 in FIG. 7 having a Delta-wing configuration. Two of the probes 12 are disposed along a line toward the rear of the aircraft 65, the third probe 12 being located on the forward portion of the aircraft 65 or some other point of the aircraft 65 noncolinear with respect to the rear probes 12.

The forward probe 12 need not lie in the plane of flight of the aircraft 65 relative to the two wing probes 12 since, as is the case with the several voltmeter stabilization units described above, the differential voltage amplifiers 14 may be adjusted such that all of the probes 12 need not lie on the equipotential surface being defined. The two rearwardly disposed probes 12 are used for roll control and the forwardly disposed probe 12 is referenced to a point, such as the "electrical center" between the rear probes 12 to provide pitch control. Essentially, the rear probes 12, in conjunction with a differential voltage amplifier as has previously been described, controls the roll stability of the aircraft 65 by feeding an output signal to a roll servomechanical apparatus 72. Since the sum of the voltages sensed by the rear probes 12 with respect to the center point is essentially zero as a function of pitch, the forward probe 12 is referenced to this voltage in order to determine the pitch angle of the aircraft. In essence, the forward probe 12 is referenced to the electrical center of or some other predetermined point between the rear probes 12, the rear probes 12 functioning as the equivalent of an extra probe. The probe effected between the rear probes 12 changes in total potential with changes in elevation, regardless of whether the aircraft is level or in a bank orientation. In this fashion, an output signal proportional to the pitch angle $\phi$ of the aircraft 65 is obtained and is fed to a pitch servomechanical apparatus 74 for correction in order to maintain a desired pitch orientation. When the monitoring of aircraft orientation and not correction is sought, a switch 76 is employed to disconnect the servomechanical apparatuses 72 and 74.

Figure 8:
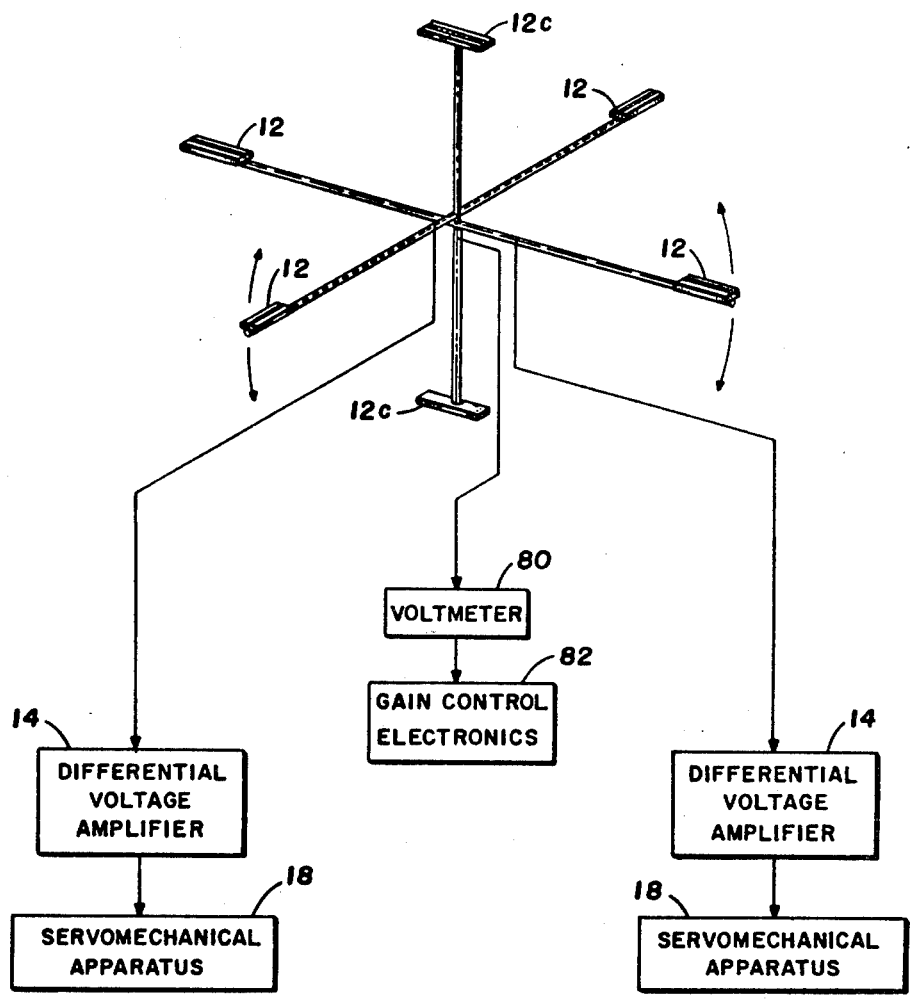
FIG. 8 is an idealized schematic view of an equipotential plane detector having additional voltage sensing probes for automatic gain control; and, FIG. 9 is a detailed diagram of the circuitry employed to determine the roll rate of an airborne vehicle.

Use of the voltmeter pair as shown in FIG. 6 or the three-probe system shown in FIG. 7 as an aircraft stabilization system requires provision for signal gain adjustment at altitudes greater than a few thousand feet. For example, the amplitude of the signals obtained from a voltmeter 10 at 10,000 feet above the earth's surface is decreased five-fold relative to signal amplitude at an altitude of 3,000 feet. This decrease in signal strength occurs due to the change in the static potential gradient with respect to altitude, the static potential gradient at sea level typically being about 180 volts/meter and as low as 10 to 20 volts/meter at an altitude of 20,000 feet. Thus, signal adjustment in the form of gain control is necessary to compensate for the decreased magnitude of the static voltage gradient at relatively high altitudes. While gain control may be provided in a number of well-known ways, an extra pair of probes 12c, such as shown in FIG. 8, may be used to sense the actual magnitude of the static potential gradient at the altitude at which an aircraft is operating, this information then being used to adjust the gain of any feedback signals being derived from the equipotential surface sensor comprised of the two voltmeters 10. The probes 12c are mounted on a vertical axis with respect to the horizontal axes joining the probes 12 of the voltmeters 10. The probes 12c are spaced apart vertically at a suitable distance so as to obtain an insignificant signal to noise ratio, the spacing being on the order of a foot or more. The probes 12c continuously sense the magnitude of the local potential gradient which is then measured by a voltmeter 80, the output signal of said voltmeter being used to actuate well-known gain control electronics 82. In addition to compensating for signal strength loss at altitude, the probes 12c lying along a vertical axis would also respond to small local variations in the static potential gradient which often occur due to atmospheric inversions or excess atmospheric ionization. Thus, addition of the probes 12c to the equipotential surface sensor comprised of the voltmeters 10 would improve the signal-to-noise ratio of the equipotential surface sensor. In addition, the probes 12c combined with the voltmeter 80 can be used to measure local variations in the static potential gradient which can be indicative of radioactive material on or below the surface of the earth, pollution sources, etc.

The device shown in FIG. 8 provides an instantaneous, accurate mechanism for automatic gain control. In most applications, an average value of the static potential gradient is adequate for providing gain control. Thus, it would not usually be necessary to mount the probes 12c on a gimballed-feedback-servo-mechanical platform to maintain the probes 12c in a vertical orientation, even though such an arrangement could be used to separate out a single (e.g. vertical) field component at lower altitudes where non-uniformities on or in the earth's surface can cause field, or potential gradient variations. Further, only one sensing probe 12c located above or below the equipotential plane defined by the voltmeters 10 may be used for gain control. Essentially, the output of this single sensing probe 12c would be compared to the zero output of the equipotential plane defined by the voltmeters 10.

Figure 9:
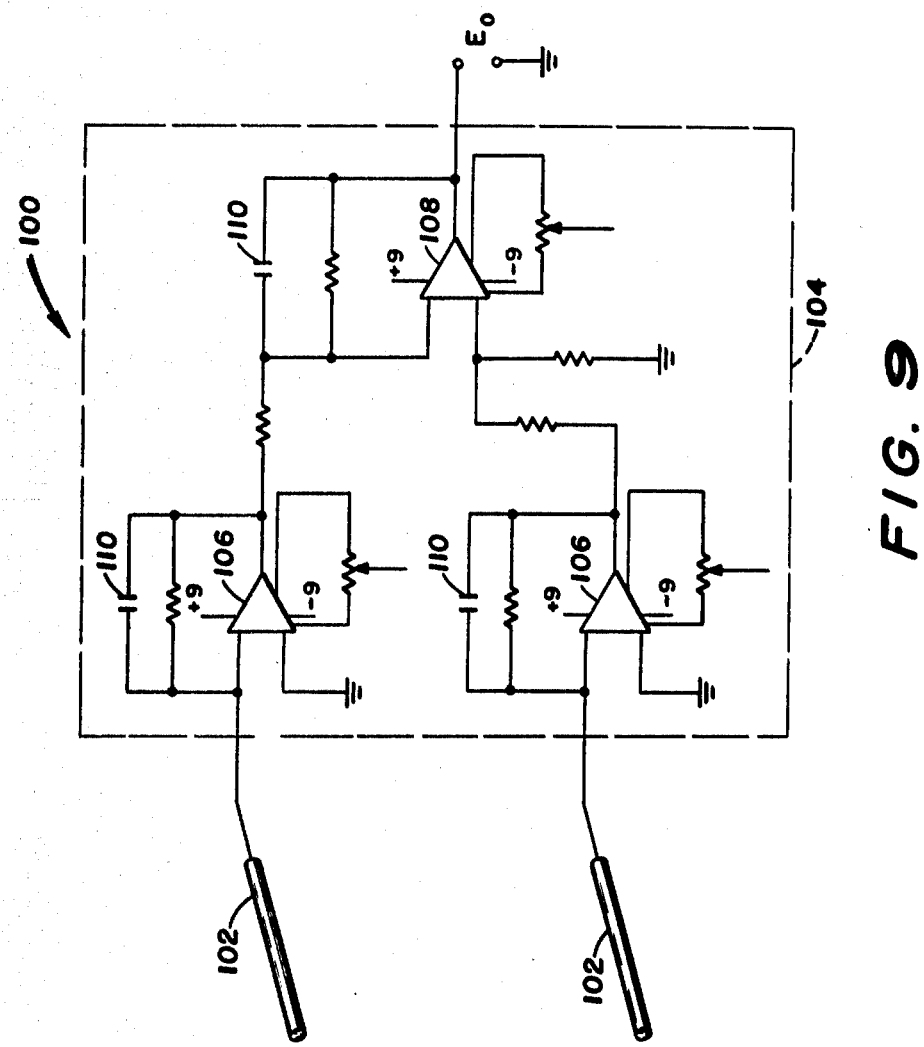

The invention may also be extended to the fabrication of a roll rate or pitch rate sensing device such as is shown at 100 in FIG. 9. The device 100 senses roll or pitch rate based on the physical principle that a displacement current is induced in an electrically conductive rod or wire on rotation of same in an electric field. The device 100 has two conductive rods 102 which may be disposed on the wingtips of an aircraft. Although the rods 102 are exposed to a continuously changing voltage field, a static electric field cannot exist in the rods. Thus, as displacement (rotation) of the rods occurs, electric charges flow from one rod 102 to the other rod. A current meter 104 inserted in the circuit between the rods 102 measures the current flowing between the rods 102, the direction of the current indicating the direction of the roll or pitch of an aircraft and the magnitude of the current indicating the rate of the roll or pitch.

The current meter 104 produces an output $E_o$ which is a voltage signal proportional to the current flowing between the rods 102. Operational amplifiers 106 convert the current flow in the circuit to a voltage signal while providing an effective short circuit between the rods 102. Operational amplifier 108 essentially functions as a differential voltmeter to measure the difference in potential between the amplifiers 106. Capacitors 110 are used in eliminate 60 cycle interference commonly encountered in the atmosphere rear power sources, etc. The output $E_o$ of the current meter 104 may be applied to conventional servomechanical apparatus (not shown) or read-out devices to control the roll or pitch rate of an aircraft or to inform the pilot. Mounting of the rods 102 on the wingtips or about the transverse axis of an aircraft yields roll rate information while mounting said rods on or about the longitudinal axis of the aircraft yields pitch rate information.

Usual practice in autopilot stabilization involves the combination of attitude and rate information. In the present invention, either the voltmeter 10 of FIG. 1 inter alia or the rate sensing device 100 of FIG. 10 can be modified to produce an output signal which is a combination of both attitude and roll rate information. This combination of information may be accomplished by adjusting the input impedance of the particular circuit, the length of the electrical conductors connected to the sensing probes 12, or the intensity of radiation from the sensing probes if the probes are radioactive. In practice, the voltmeter 10 of FIG. 2 produces some rate information even as the device 100 of FIG. 10 produces some attitude information.

The invention disclosed herein may be practiced with modification to the structures and methods outlined above without departing from the scope of the invention as recited in the appended claims. For example, the probes 12 may be disposed at an angle to the roll axis or pitch axis of an airborne vehicle being stabilized according to the invention. The angle at which a line joining the probes 12 may make with the roll axis or pitch axis can approach 45°. Well-known "calibration" techniques can be employed to adjust the voltmeter 10 to compensate for this angular misalignment. In general, where a signal is generated in response to a difference in two sensed potentials, a similar signal generated by the output of a fluxmeter can be used instead, as mentioned previously.

What is claimed is:

1. A method of defining equipotential lines and surfaces in the essentially vertical static electric field existing in the earth's atmosphere, comprising the steps of:
   sensing the electrostatic potential at a first point and at a second point in the atmosphere;
   generating a first potential difference signal proportional to the magnitude of the difference between the two sensed potentials; and
   utilizing said first potential difference signal to indicate misalignment between a line interconnecting said points and an equipotential line intersecting the interconnecting line at a minimal angle comprising the steps of:
      describing a line interconnecting the first and second point and selecting a reference point on the interconnecting line,
      calculating the potential gradient at the reference point, and
      determining from the potential gradient and the interconnecting line the essentially vertical angle of misalignment between the line interconnecting the first and second points and an equipotential line passing through the reference point.

2. A method, as in claim 1, further comprising the steps of:
   sensing the electrostatic potential at a third point which is noncolinear with the other two points,
   determining the electrostatic potential at a predetermined point along the interconnecting line, and
   generating a second potential difference signal proportional to the difference between the potential at the third point and the potential at the predetermined point.

3. A method, as in claim 2, further comprising the step of:
   selecting the predetermined point such that the line including the predetermined point and the third point is perpendicular to the line interconnecting the first and second spaced points.

4. A method, as in claim 3, wherein the line including the third and predetermined points bisects the line interconnecting the first and second points.

5. A method, as in claim 1, further comprising the step of:
   sensing the electrostatic potential at a third and fourth point, which together define a line which is noncolinear with the line interconnecting the first two space points.

6. A method, as in claim 5, wherein the line interconnecting the first and second points intersects and is perpendicular to the line including the third and fourth points, and further comprising the steps of:
   generating a second potential difference signal proportional to the difference between the potential at the third point and the potential at the fourth point, and
   utilizing said second potential difference signal to indicate misalignment between the line including said third and fourth points and the equipotential line which forms a minimal angle with the line including said third and fourth points, comprising the steps of:
   describing a line interconnecting the third and fourth point and selecting an index point on the interconnecting line,
   calculating the potential gradient at the index point, and
   determining from the potential gradient and the interconnecting line the essentially vertical angle of misalignment between the line interconnecting the third and fourth points and an equipotential line passing through the index point.

7. A method, as in claim 1, further comprising the step of:
   adjusting the positions of the two spaced points to reduce the potential difference signal until no misalignment is indicated.

* * * * *